(12) United States Patent
Ma (10) Patent No.: US 11,011,714 B2
(45) Date of Patent: May 18, 2021

(54) FLEXIBLE ORGANIC ELECTROLUMINESCENCE DEVICE (OLED) DISPLAY PANEL AND MANUFACTURING METHOD THEREOF

(71) Applicant: WUHAN CHINA STAR OPTOELECTRONICS SEMICONDUCTOR DISPLAY TECHNOLOGY CO., LTD., Wuhan (CN)

(72) Inventor: Weixin Ma, Wuhan (CN)

(73) Assignee: WUHAN CHINA STAR OPTOELECTRONICS SEMICONDUCTOR DISPLAY TECHNOLOGY CO., LTD., Wuhan (CN)

(*) Notice: Subject to any disclaimer, the term of this patent is extended or adjusted under 35 U.S.C. 154(b) by 307 days.

(21) Appl. No.: 16/326,233

(22) PCT Filed: Nov. 15, 2018

(86) PCT No.: PCT/CN2018/115640
§ 371 (c)(1),
(2) Date: Feb. 18, 2019

(87) PCT Pub. No.: WO2020/073423
PCT Pub. Date: Apr. 16, 2020

(65) Prior Publication Data
US 2021/0098722 A1    Apr. 1, 2021

(30) Foreign Application Priority Data

Oct. 8, 2018  (CN) .......................... 201811165731.6

(51) Int. Cl.
*H01L 51/00*    (2006.01)
*H01L 51/56*    (2006.01)
(Continued)

(52) U.S. Cl.
CPC .......... *H01L 51/0097* (2013.01); *H01L 51/56* (2013.01); *H05K 1/0274* (2013.01);
(Continued)

(58) Field of Classification Search
CPC .......... H05K 2201/09036; H05K 2201/09136; H05K 2201/09063; H05K 2201/09072;
(Continued)

(56) References Cited

U.S. PATENT DOCUMENTS 9,143,668 B2 * 9/2015 Mathew ................ G06F 1/1686
10,212,819 B2 * 2/2019 Ahn ..................... H05K 1/0296
(Continued)

FOREIGN PATENT DOCUMENTS

| CN | 108257514 A | * | 7/2018 | ............. G09F 9/302 |
| CN | 207720239 U | * | 8/2018 | ............. H04N 5/225 |
| CN | 108551543 A | * | 9/2018 | ............. H04N 5/225 |

OTHER PUBLICATIONS

Machine translation, Xu, Chinese Pat. Pub. No. CN 207720239U, translation date: Feb. 13, 2021, Espacenet, all pages. (Year: 2021).*
(Continued)

*Primary Examiner* — Victoria K. Hall
(74) *Attorney, Agent, or Firm* — JMB Davis Ben-David (57) ABSTRACT

A flexible OLED display panel and a manufacturing method for a flexible OLED display panel are provided. A through hole defined in a flexible substrate is filled with a transparent layer such that the flexible OLED display panel looks as an integral structure visually and more conforms to visual effect of full screens.

12 Claims, 9 Drawing Sheets

(51) Int. Cl.
  *H05K 1/02* (2006.01)
  *H05K 1/03* (2006.01)
(52) U.S. Cl.
  CPC . *H05K 1/0393* (2013.01); *H05K 2201/09063* (2013.01); *H05K 2201/09072* (2013.01); *H05K 2201/09163* (2013.01); *H05K 2201/10121* (2013.01)
(58) Field of Classification Search
  CPC ........ H05K 2201/05–058; H05K 2201/10121; H05K 1/0393; H05K 1/0274; H05K 2201/09163; H01L 51/00–56; H01L 2251/00–568; H01L 51/0097
  See application file for complete search history.

(56) References Cited

U.S. PATENT DOCUMENTS

| | | | | |
|---|---|---|---|---|
| 10,490,771 | B2* | 11/2019 | Kim | H01L 51/5243 |
| 10,936,096 | B2* | 3/2021 | Bai | G06F 1/1643 |
| 2004/0183193 | A1* | 9/2004 | Koide | H05K 1/141 |
| | | | | 257/734 |
| 2013/0169515 | A1* | 7/2013 | Prushinskiy | H01L 51/525 |
| | | | | 345/55 |
| 2013/0293772 | A1* | 11/2013 | Kim | H05K 1/181 |
| | | | | 348/374 |
| 2014/0295150 | A1* | 10/2014 | Bower | C09J 7/10 |
| | | | | 428/201 |
| 2015/0305138 | A1* | 10/2015 | Tombs | H05K 3/107 |
| | | | | 29/850 |
| 2015/0313004 | A1* | 10/2015 | Namkung | G09F 9/301 |
| | | | | 361/749 |
| 2015/0381929 | A1* | 12/2015 | Lee | G06F 1/1686 |
| | | | | 348/14.03 |
| 2016/0271914 | A1* | 9/2016 | Xie | B32B 27/302 |
| 2017/0048990 | A1* | 2/2017 | Sim | H04M 1/026 |
| 2017/0092884 | A1* | 3/2017 | Zhang | G06F 3/0412 |
| 2017/0263887 | A1* | 9/2017 | Han | H01L 27/3244 |
| 2017/0295304 | A1* | 10/2017 | Hu | H04N 5/2254 |
| 2018/0004330 | A1* | 1/2018 | Kim | H01L 51/5281 |
| 2018/0090702 | A1* | 3/2018 | Um | H01L 51/56 |
| 2018/0143353 | A1* | 5/2018 | Kim | B29D 11/00278 |
| 2018/0196475 | A1* | 7/2018 | Bao | G06F 1/1637 |
| 2018/0217639 | A1* | 8/2018 | Jones | G06F 1/1652 |
| 2018/0332202 | A1* | 11/2018 | Lee | H04N 5/2257 |
| 2019/0019737 | A1* | 1/2019 | Hogyoku | H01L 27/14618 |
| 2019/0067408 | A1* | 2/2019 | Sun | G06K 9/0004 |
| 2019/0072997 | A1* | 3/2019 | Cha | G06F 1/1656 |
| 2019/0081128 | A1* | 3/2019 | Yu | H01L 51/0097 |
| 2019/0103569 | A1* | 4/2019 | Zhai | H01L 51/5253 |
| 2019/0132946 | A1* | 5/2019 | Yang | H05K 1/0272 |
| 2019/0132947 | A1* | 5/2019 | Koo | H05K 1/0281 |
| 2019/0132987 | A1* | 5/2019 | Koo | H05K 5/0217 |
| 2019/0205596 | A1* | 7/2019 | Kim | B06B 1/0692 |
| 2019/0214596 | A1* | 7/2019 | Park | H01L 27/3276 |
| 2019/0334128 | A1* | 10/2019 | Kim | H01L 51/0097 |
| 2019/0387145 | A1* | 12/2019 | Momiuchi | G03B 17/02 |
| 2019/0392736 | A1* | 12/2019 | Kishimoto | H05B 33/10 |
| 2020/0057545 | A1* | 2/2020 | Seomoon | G06F 3/04883 |
| 2020/0084897 | A1* | 3/2020 | Shin | H05K 1/147 |
| 2020/0089274 | A1* | 3/2020 | Kim | G06F 1/1652 |
| 2020/0161384 | A1* | 5/2020 | Wang | G02F 1/1333 |
| 2020/0166970 | A1* | 5/2020 | Yeom | G06F 1/1626 |
| 2020/0175904 | A1* | 6/2020 | Zhang | G09G 3/20 |
| 2020/0236259 | A1* | 7/2020 | Nakamura | G02F 1/133512 |
| 2021/0074876 | A1* | 3/2021 | Kishimoto | G09F 9/33 |

OTHER PUBLICATIONS

Machine translation, Zhang, Chinese Pat. Pub. No. CN 108551543A, translation date: Feb. 13, 2021, Espacenet, all pages. (Year: 2021).*
Machine translation, Liu, Chinese Pat. Pub. No. 108257514A, translation date: Feb. 13, 2021, Espacenet, all pages. (Year: 2021).*

* cited by examiner

FIG. 5H

FLEXIBLE ORGANIC ELECTROLUMINESCENCE DEVICE (OLED) DISPLAY PANEL AND MANUFACTURING METHOD THEREOF

CROSS-REFERENCE TO RELATED APPLICATIONS

This is the U.S. National Stage of International Patent Application No. PCT/CN2018/115640, filed Nov. 15, 2018, which in turn claims the benefit of Chinese Patent Application No. 201811165731.6, filed Oct. 8, 2018.

FIELD OF INVENTION

The present invention relates to fields of displays, especially to a flexible organic electroluminescence device (OLED) display panel and a manufacturing method thereof.

BACKGROUND OF INVENTION

Full screen mobile phones are used more and more extensively, and displays with a high body to screen ratio are more and more popular. The so-called body to screen ratio is the ratio of an area of the screen and an area of the entire display panel. A higher body to screen ratio brings better visual experience to users. Full screen display has a high body to screen ratio and has excellent displaying effect. Therefore, full screen display panels are more and more popular among consumers and have become an inevitable trend in the future development of electronic devices such as mobile phones.

Active-matrix organic light emitting diode (AMOLED) display panels are widely used display panels. In the current design of the AMOLED display panel, it is required to employ a laser cutting process to cut an upper portion of the display panel to for a notch, as so-called "bangs screen".

Figure 1:
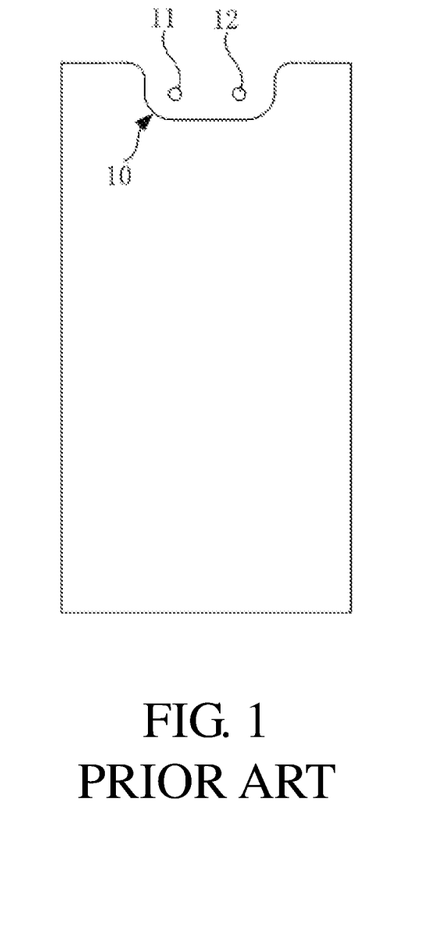
FIG. 1 is a schematic top view of a conventional flexible organic electroluminescence device (OLED) display panel.

FIG. 1 is a schematic top view of a conventional flexible OLED display panel. With reference to FIG. 1, an upper portion of the display panel 1 is cut by laser to form a notch 10. Devices such as a camera lens 11 and sensor 12 are disposed in the notch 10. Disadvantage of such display panel 1 is that the upper portion of the display panel 1 to form the notch 10 such that the display panel 1 is shaped irregularly, lacks visual aesthetic feeling, and looks fragmental instead of being an integral screen.

SUMMARY OF INVENTION

The present invention solves the technical issue by providing a flexible OLED display panel and a manufacturing method thereof such that the flexible OLED display panel is an integral structure and conforms with visual effect of a full screen display.

To solve the above technical issue, the present invention provides a flexible organic electroluminescence device (OLED) display panel, comprising a flexible substrate and an organic electroluminescence device (OLED) layer, wherein at an upper end of the flexible OLED display panel, the flexible substrate comprises a through hole, the through hole is defined through the flexible substrate along a direction of a thickness of the flexible substrate, a transparent layer is filled into the through hole, the organic electroluminescence device layer covers the flexible substrate and the transparent layer, a surface of the transparent layer facing the organic electroluminescence device layer is flush with a surface of the flexible substrate facing the organic electroluminescence device layer, the organic electroluminescence device layer comprises a plurality of thin film transistors arranged in an array and a plurality of organic electroluminescence devices arranged in an array, wherein each of the organic electroluminescence devices is controlled by a corresponding one of the thin film transistors to emit light, and the through hole is a notch.

In an embodiment, a density of the thin film transistors and the organic electroluminescence devices above the transparent layer is less than a density of the thin film transistors and the organic electroluminescence devices in a region of the flexible substrate that is not disposed with the transparent layer.

To solve the above technical issue, the present invention also provides a flexible OLED display panel, comprising a flexible substrate and an organic electroluminescence device layer, wherein at an upper end of the flexible OLED display panel, the flexible substrate comprises a through hole, the through hole is defined through the flexible substrate along a direction of a thickness of the flexible substrate, a transparent layer is filled into the through hole, the organic electroluminescence device layer covers the flexible substrate and the transparent layer.

In an embodiment, a surface of the transparent layer facing the organic electroluminescence device layer is flush with a surface of the flexible substrate facing the organic electroluminescence device layer.

In an embodiment, the organic electroluminescence device layer comprises a plurality of thin film transistors arranged in an array and a plurality of organic electroluminescence devices arranged in an array, wherein each of the organic electroluminescence devices is controlled by a corresponding one of the thin film transistors to emit light.

In an embodiment, a density of the thin film transistors and the organic electroluminescence devices above the transparent layer is less than a density of the thin film transistors and the organic electroluminescence devices in a region of the flexible substrate that is not disposed with the transparent layer.

In an embodiment, the through hole is a notch.

The present invention also provides a manufacturing method for the above flexible organic electroluminescence device (OLED) display panel, comprising steps as follows:

providing a hard substrate;

forming a flexible substrate on the hard substrate;

at an upper end of the flexible substrate, cutting the flexible substrate along a direction of a thickness of the flexible substrate, and forming a through hole defined through the flexible substrate along the direction of the thickness of the flexible substrate; filling the through hole with a transparent layer; forming an organic electroluminescence device layer on the flexible substrate and the transparent layer; and removing the hard substrate and forming the flexible OLED display panel.

In an embodiment, the manufacturing method further comprises a step as follows: manufacturing a release film on the hard substrate, forming the flexible substrate on the release film.

In an embodiment, in the step of removing the hard substrate, the hard substrate and the release film are removed by a mechanical stripping process.

In an embodiment, the step of filling the through hole with a transparent layer comprises steps as follows: coating a photoresist layer on the flexible substrate, wherein the photoresist layer is filled into the through hole and covers the flexible substrate; and removing the photoresist layer on the flexible substrate while retaining the photoresist layer filled in the through hole, wherein the photoresist layer filled in the through hole serves as the transparent layer.

In an embodiment, in the step of removing the photoresist layer on the flexible substrate, a thickness of the photoresist layer filled in the through hole is decreased, such that a surface of the photoresist layer filled in the through hole is flush with a surface of the flexible substrate.

Advantages

Advantages of the present invention are that the through hole defined in the flexible substrate is filled with the transparent layer such that the flexible OLED display panel looks as an integral structure visually and more conforms to visual effect of full screens.

DETAILED DESCRIPTION OF PREFERRED EMBODIMENTS

Detailed embodiments of a flexible organic electroluminescence device (OLED) display panel and a manufacturing method thereof provided by the present invention will be described with accompanying drawings.

Figure 2:
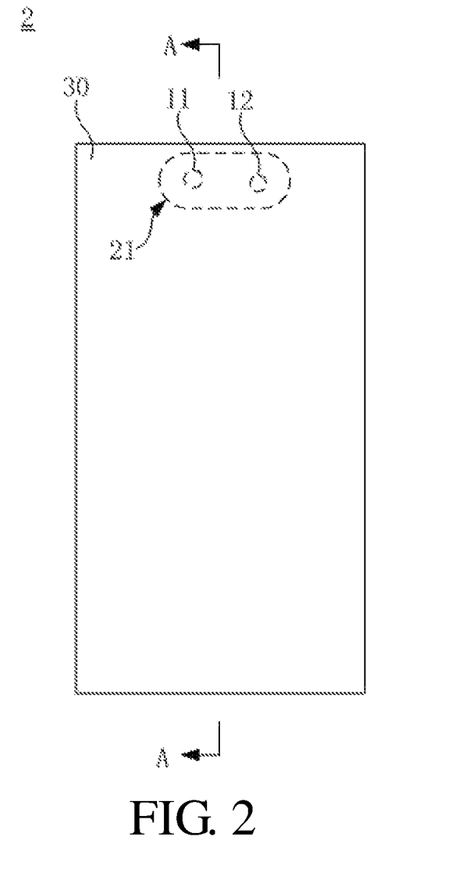
FIG. 2 is a schematic top view of an embodiment of a flexible organic electroluminescence device (OLED) display panel of the present invention.
Figure 3:
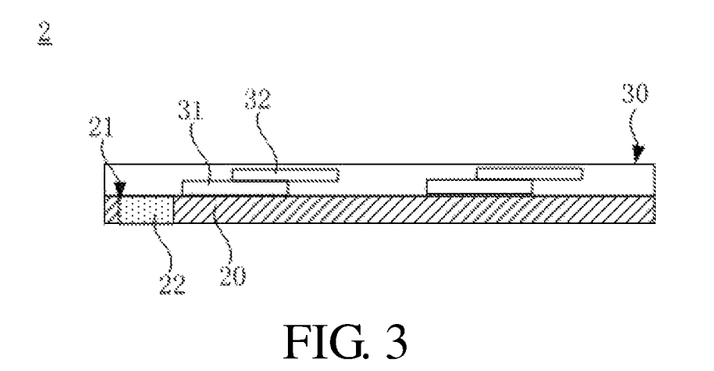
FIG. 3 is a schematic cross-sectional view along line A-A in FIG. 2.

FIG. 2 is a schematic top view of an embodiment of a flexible OLED display panel of the present invention. FIG. 3 is a schematic cross-sectional view along line A-A in FIG. 2. With reference to FIGS. 2 and 3, the present invention flexible OLED display panel 2 includes a flexible substrate 20 and an organic electroluminescence device (OLED) layer 30. The organic electroluminescence device layer 30 covers the flexible substrate 20.

The flexible substrate 20 is made of a light transmissive material. For instance, the flexible substrate 20 can be made of polyimide (PI), polycarbonate (PC), polyester (PET), cyclic olefin copolymer (COC), metallocene-based cyclic olefin copolymer (mCOC) or other material. In the present embodiment, the flexible substrate 20 is made of polyimide (PI). At an upper end of the flexible OLED display panel 2, the flexible substrate 20 includes a through hole 21. Because the flexible substrate 20 is covered by the organic electroluminescence device layer 30 and the through hole 21 is also covered by the organic electroluminescence device layer 30, in the top view of FIG. 2, the through hole 21 is not exposed. Therefore, broken lines are used in FIG. 2 to illustratively depict the through hole 21. The through hole 21 is defined through the flexible substrate 20 along a direction of a thickness of the flexible substrate 20. In the present embodiment, the through hole 21 is disposed at an upper end of the flexible substrate 20, but is not defined through the upper end. In other embodiment, the through hole 21 is defined through the upper end of the flexible substrate 20 and forms a notch 10 as shown in FIG. 1.

A transparent layer 22 is filled in the through hole 21. The transparent layer 22 includes but is not limited to an organic layer. For instance, photoresist layer. The organic electroluminescence device layer 30 covers the flexible substrate 20 and the transparent layer 22. Preferably, a surface of the transparent layer 22 facing the organic electroluminescence device layer 30 is flush with a surface of the flexible substrate 21 facing the organic electroluminescence device layer 30.

To assemble the flexible OLED display panel 2 with other parts to form a display device, functional parts such as camera lens and sensor of the display device are disposed on corresponding positions of the transparent layer 22 to prevent the flexible substrate 20 from blocking the functional parts. At the meantime, because filling of the transparent layer 22, in the place of the through hole 21, the flexible OLED display panel 2 has no defects such that the flexible OLED display panel 2 of the present invention has no irregular structures as shown in FIG. 1. When observed visually, placement of the flexible OLED display panel 2 of the present invention is more reasonable and more conforms to full screen visual effect when compared to the "bangs screen" as shown in FIG. 1.

The organic electroluminescence device layer 30 includes a plurality of thin film transistors 31 arranged in an array and a plurality of organic electroluminescence devices 32 arranged in an array. Each of the organic electroluminescence devices 32 corresponds to one of the thin film transistors 31 to emit light. Structures of the thin film transistors 31 and the organic electroluminescence devices 32 are known in the art and will not be described herein. A density of the thin film transistors 31 and the organic electroluminescence devices 32 above the transparent layer 22 is less than a density of the thin film transistors 31 and the organic electroluminescence devices 32 in a region of the flexible substrate 21 that is not disposed with the transparent layer 22. In other words, a region above the transparent layer 22 has the thin film transistors 31 and the organic electroluminescence devices 32 distributed sparsely to prevent the thin film transistors 31 and the organic electroluminescence devices 32 from blocking the functional parts of the display device.

The present invention also provides a manufacturing method for the above flexible OLED display panel. FIGS. 4A to 4G are flowcharts of processes of an embodiment of a manufacturing method for a flexible OLED display panel of the present invention.

Figure 4A:
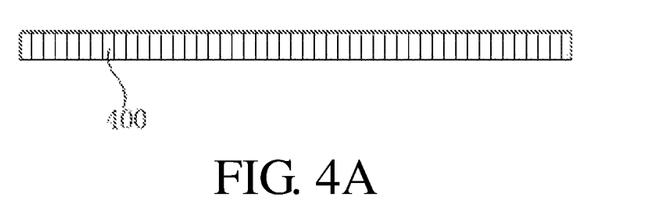
FIGS. 4A to 4G are flowcharts of processes of an embodiment of a manufacturing method for a flexible OLED display panel of the present invention.

With reference to FIG. 4A, a step includes providing hard substrate 400. The hard substrate 400 can be made of glass, quartz, wafer, ceramic or other suitable material. For instance, in the present embodiment, the hard substrate 400 is made of glass. The hard substrate 400 performs supporting function for later structures.

Figure 4B:
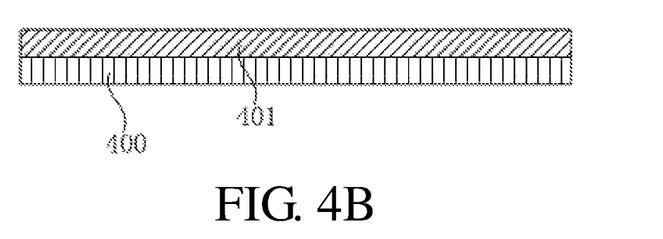

With reference to FIG. 4B, a step includes forming a flexible substrate 401 on the hard substrate 400. The flexible substrate 401 can be made of polyimide (PI), polycarbonate (PC), polyester, (PET), cyclic olefin copolymer (COC), metallocene-based cyclic olefin copolymer (mCOC), or other suitable material. In the present embodiment, the flexible substrate 401 is made of polyimide (PI).

Figure 4C:
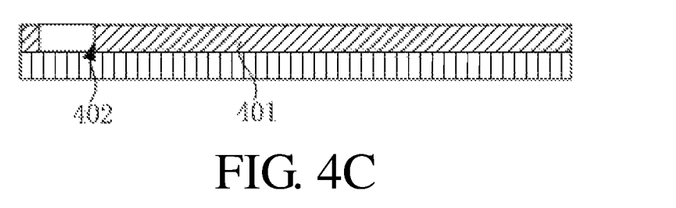

With reference to FIG. 4C, a step includes at an upper end of the flexible substrate 401, cutting the flexible substrate 401 along a direction of a thickness of the flexible substrate 401, and forming a through hole 402 defined through the flexible substrate 401 along the direction of the thickness of the flexible substrate 401. A cutting process for cutting the flexible substrate 401 can be a laser cutting process or a mechanical cutting process. In the present embodiment, the cutting process for cutting the flexible substrate 401 can be the laser cutting process.

Figure 4D:
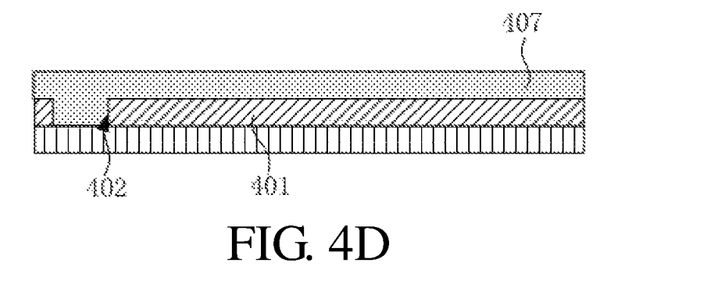
Figure 4E:
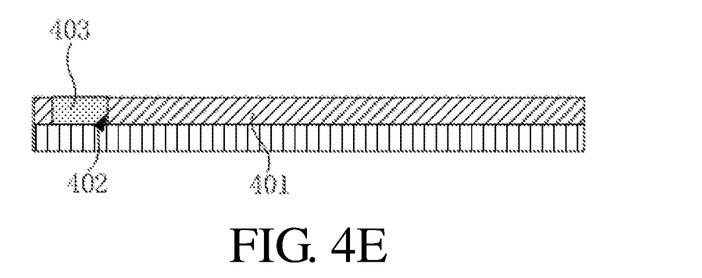

With reference to FIGS. 4D and 4E, a step includes filling the through hole 402 with a transparent layer 403. The transparent layer 403 can be an inorganic material or an organic material. For instance, in the present embodiment, the transparent layer 403 is a photoresist material. Because of the filling of the transparent layer 403, the flexible substrate 401 looks as one piece without any defects such as notches.

In the present embodiment, a method of forming the transparent layer 403 includes steps as follows. With reference to FIG. 4D, a step includes coating a photoresist layer 407 on the flexible substrate 401, wherein the photoresist layer 407 is filled into the through hole 402 and covers the flexible substrate 401. With reference to FIG. 4E, a step includes removing the photoresist layer 407 on the flexible substrate 401 while retaining the photoresist layer in the through hole 402, wherein the photoresist layer filled in the through hole 402 serves as the transparent layer 403. A process of removing the photoresist layer 407 is generally an ashing process or an etching process. Furthermore, in the step of removing the photoresist layer on the flexible substrate 401, a thickness of the photoresist layer filled in the through hole 402 is decreased such that a surface of the photoresist layer filled in the through hole 402 is flush with a surface of the flexible substrate 401 to further make the surface of the transparent layer 403 be flush with the surface of the flexible substrate 401 and therefore further make the flexible substrate 401 look as one piece without any defects such as notches.

Figure 4F:
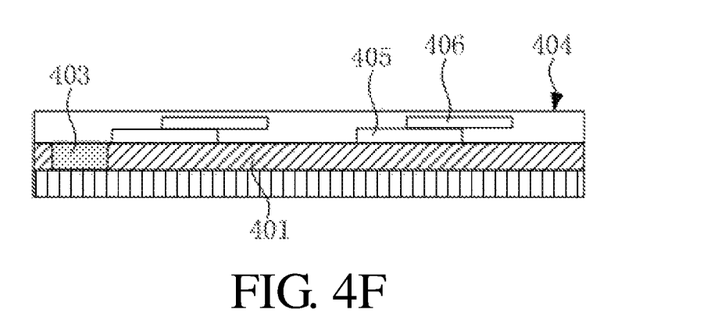

With reference to FIG. 4F, an organic electroluminescence device layer 404 is formed on the flexible substrate 401 and the transparent layer 403. The organic electroluminescence device layer 404 includes a plurality of thin film transistors 405 arrange in an array and a plurality of organic electroluminescence devices 406 arranged in an array. Each of the organic electroluminescence devices 406 is controlled by a corresponding one of the thin film transistors 405 to emit light. The structures of the thin film transistors 405 and the organic electroluminescence devices 406 are known in the art and will not be described repeatedly herein. A density of the thin film transistors 405 and the organic electroluminescence devices 406 above the transparent layer 403 is less than a density of the thin film transistors 405 and the organic electroluminescence devices 406 in a region of the flexible substrate 401 that is not disposed with the transparent layer 403. In other words, a region above the transparent layer 403 has the thin film transistors 405 and the organic electroluminescence devices 406 distributed sparsely to prevent the thin film transistors 405 and the organic electroluminescence devices 406 from blocking the functional parts of the display device.

Figure 4G:
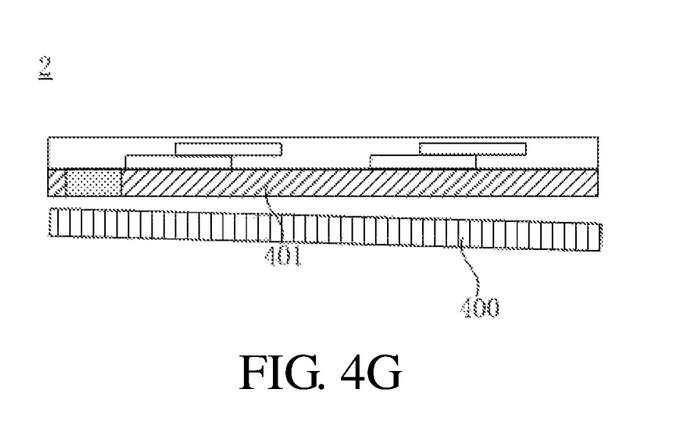

With reference to FIG. 4G, a step includes removing the hard substrate 400 and forming the flexible OLED display panel 2. A process of removing the hard substrate 400 includes but is not limited to a laser stripping process or a mechanic stripping process. In the present embodiment, because adhering force between the hard substrate 400 and the flexible substrate 401 is strong, the mechanic stripping process is not suitably applied. Therefore, the present embodiment employs the laser stripping process to remove the hard substrate 400.

FIGS. 5A to 5H are flowcharts of processes of another embodiment of a manufacturing method for a flexible organic electroluminescence device (OLED) display panel of the present invention.

Figure 5A:
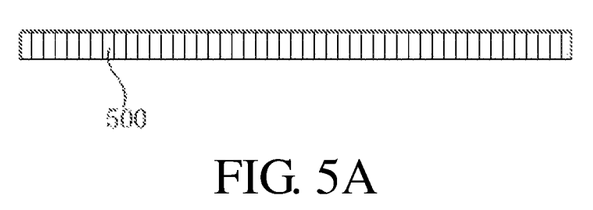
FIGS. 5A to 5H are flowcharts of processes of another embodiment of a manufacturing method for a flexible OLED display panel of the present invention.

With reference to FIG. 5A, a step includes providing a hard substrate 500. The hard substrate 500 can be made of glass, quartz, wafer, ceramic or other suitable material. For instance, in the present embodiment, the hard substrate 500 is made of glass. The hard substrate 500 performs supporting function for later structures.

Figure 5B:
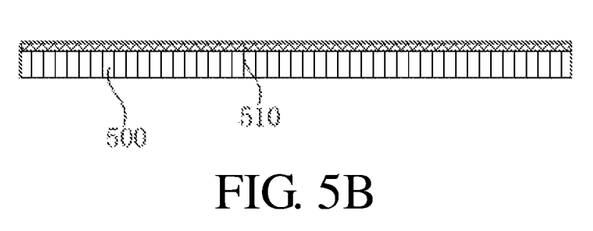

With reference to FIG. 5B, a step includes forming a release film 510 on the hard substrate 500. A material for manufacturing the release film 510 includes but is not limited to a-Si.

Figure 5C:
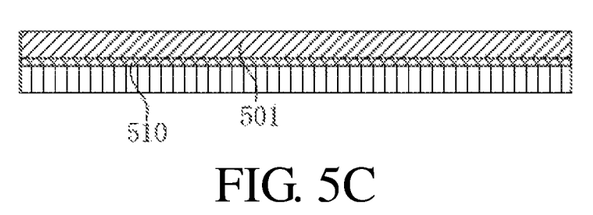

With reference to FIG. 5C, a step includes forming a flexible substrate 501 on the release film 510. The flexible substrate 501 can be made of polyimide (PI), polycarbonate (PC), polyester (PET), cyclic olefin copolymer (COC), metallocene-based cyclic olefin copolymer (mCOC), or other material. in the present embodiment, the flexible substrate 501 is made of polyimide (PI). The release film 510 can decrease the attaching force of the flexible substrate 501 such that the flexible substrate 501 can be smoothly separated from hard substrate 500 in later processes.

Figure 5D:
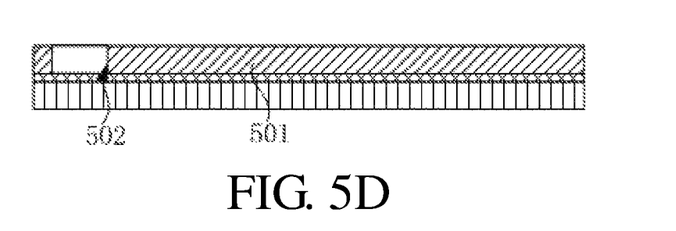

With reference to FIG. 5D, a step includes at an upper end of the flexible substrate 501, cutting the flexible substrate 501 along a direction of a thickness of the flexible substrate 501, and forming a through hole 502 defined through the flexible substrate 501 along the direction of the thickness of the flexible substrate 501. A cutting process for cutting the flexible substrate 501 can be a laser cutting process or a mechanical cutting process. In the present embodiment, the cutting process for cutting the flexible substrate 501 can be the laser cutting process.

Figure 5E:
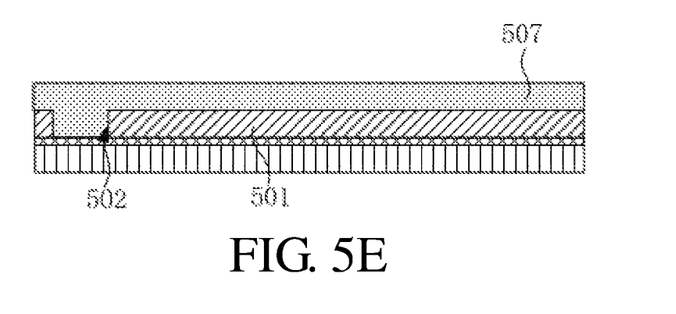
Figure 5F:
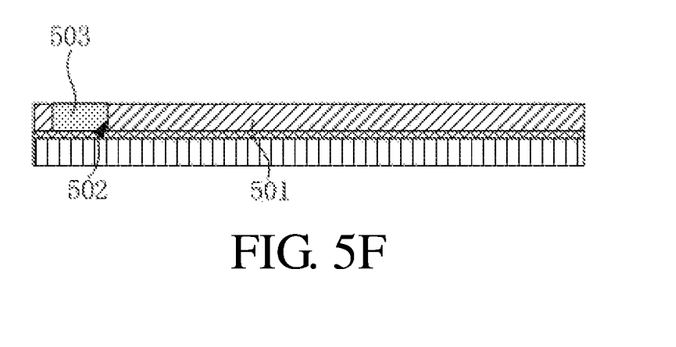

With reference to FIGS. 5E and 5F, a step includes filling the through hole 502 with a transparent layer 503. The transparent layer 503 can be an inorganic material or an organic material. For instance, in the present embodiment, the transparent layer 503 is a photoresist material. Because of the filling of the transparent layer 503, the flexible substrate 501 looks as one piece without any defects such as notches.

In the present embodiment, a method of forming the transparent layer 503 includes steps as follows. With reference to FIG. 5E, a step includes coating a photoresist layer 507 on the flexible substrate 501, wherein the photoresist layer 507 is filled into the through hole 502 and covers the flexible substrate 501. With reference to FIG. 5F, a step includes removing the photoresist layer 507 on the flexible substrate 501 while retaining the photoresist layer in the through hole 502, wherein the photoresist layer filled in the through hole 502 serves as the transparent layer 503. A process of removing the photoresist layer 507 is generally an ashing process or an etching process. Furthermore, in the step of removing the photoresist layer on the flexible substrate 501, a thickness of the photoresist layer filled in the through hole 502 is decreased such that a surface of the photoresist layer filled in the through hole 502 is flush with a surface of the flexible substrate 501 to further make the surface of the transparent layer 503 be flush with the surface of the flexible substrate 501 and therefore further make the flexible substrate 501 look as one piece without any defects such as notches.

Figure 5G:
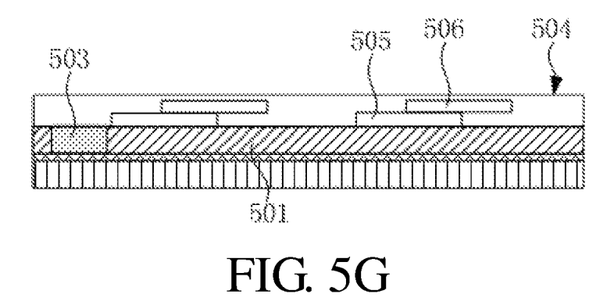

With reference to FIG. 5G, a step includes forming an organic electroluminescence device layer 504 on the flexible substrate 501 and the transparent layer 503. The organic electroluminescence device layer 504 includes a plurality of thin film transistors 505 arranged in an array and a plurality of organic electroluminescence devices 506 arranged in an array. Each of the organic electroluminescence devices 506 is controlled by a corresponding one of the thin film transistors 505 to emit light. The structures of the thin film transistors 505 and the organic electroluminescence devices 506 are known in the art and will not be described repeatedly herein. a density of the thin film transistors 505 and the organic electroluminescence devices 506 above the transparent layer 503 is less than a density of the thin film transistors 505 and the organic electroluminescence devices 506 in a region of the flexible substrate 501 that is not disposed with the transparent layer 503. In other words, a region above the transparent layer 503 has the thin film transistors 505 and the organic electroluminescence devices 506 distributed sparsely to prevent the thin film transistors 505 and the organic electroluminescence devices 506 from blocking the functional parts of the display device.

Figure 5H:
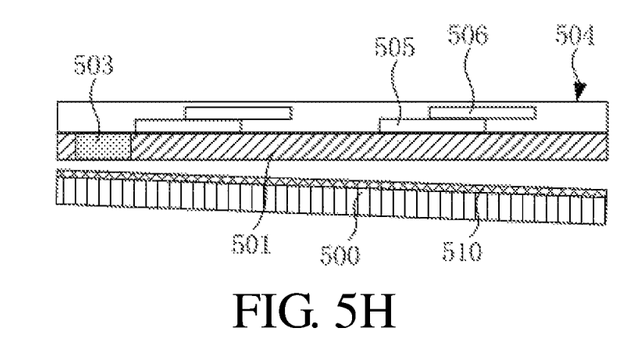

With reference to FIG. 5H, a step includes removing the hard substrate 500 and forming the flexible OLED display panel 2. In the present embodiment, a process of removing the hard substrate 500 is a mechanic stripping process. In the prior art, the hard substrate is stripped by the laser stripping process, and then the flexible OLED display panel is cut to form the notch 10, as shown in FIG. 1. The laser stripping process has no influence to an exposed edge of the notch 10. In the manufacturing method of the present invention, after the through hole 502 is formed, the hard substrate 500 is removed by the stripping process. If the hard substrate 500 is removed by the laser stripping process, laser energy affects the exposed edge of the through hole 502 such that the flexible OLED display panel is damaged. Therefore, in the present embodiment, a release film 510 is disposed between the hard substrate 500 and the flexible substrate 501. The release film 510 decreases an adhering force between the hard substrate 500 and the flexible substrate 501. Therefore, the hard substrate 500 and the release film 510 can be removed by a mechanic stripping process to prevent laser energy from affecting the exposed edge of the through hole 502.

The above descriptions are only for preferred embodiments of the present invention. It should be noted that those skilled in the art can make several improvements and retouching without departing from the principle of the present invention, and these improvements and modifications should also be deemed as the scope of protection of the present invention.

INDUSTRIAL APPLICABILITY

The subject matter of the present invention can be manufactured and fabricated in the industry and has industrial applicability.

What is claimed is:

1. A flexible organic electroluminescence device (OLED) display panel, comprising a flexible substrate and an organic electroluminescence device (OLED) layer, wherein at an upper end of the flexible OLED display panel, the flexible substrate comprises a through hole, the through hole is defined through the flexible substrate along a direction of a thickness of the flexible substrate, a transparent layer is filled into the through hole of the flexible substrate, the organic electroluminescence device layer covers the flexible substrate and the transparent layer, a surface of the transparent layer facing the organic electroluminescence device layer is flush with a surface of the flexible substrate facing the organic electroluminescence device layer, and the organic electroluminescence device layer comprises a plurality of thin film transistors arranged in an array and a plurality of organic electroluminescence devices arranged in an array, wherein each of the organic electroluminescence devices is controlled by a corresponding one of the thin film transistors to emit light, and the through hole is a notch.

2. The flexible OLED display panel as claimed in claim 1, wherein a density of the thin film transistors and the organic electroluminescence devices above a portion of the flexible substrate that is disposed with the transparent layer is less than a density of the thin film transistors and the organic electroluminescence devices above another portion of the flexible substrate that is not disposed with the transparent layer.

3. A flexible organic electroluminescence device (OLED) display panel, comprising a flexible substrate and an organic electroluminescence device layer, wherein at an upper end of the flexible OLED display panel, the flexible substrate comprises a through hole, the through hole is defined through the flexible substrate along a direction of a thickness of the flexible substrate, a transparent layer is filled into the through hole of the flexible substrate, and the organic electroluminescence device layer covers the flexible substrate and the transparent layer.

4. The flexible OLED display panel as claimed in claim 3, wherein a surface of the transparent layer facing the organic electroluminescence device layer is flush with a surface of the flexible substrate facing the organic electroluminescence device layer.

5. The flexible OLED display panel as claimed in claim 4, wherein the organic electroluminescence device layer comprises a plurality of thin film transistors arranged in an array and a plurality of organic electroluminescence devices arranged in an array, wherein each of the organic electroluminescence devices is controlled by a corresponding one of the thin film transistors to emit light.

6. The flexible OLED display panel as claimed in claim 4, wherein a density of the thin film transistors and the organic electroluminescence devices above a portion of the flexible substrate that is disposed with the transparent layer is less than a density of the thin film transistors and the organic electroluminescence devices above another portion of the flexible substrate that is not disposed with the transparent layer.

7. The flexible OLED display panel as claimed in claim 3, wherein the through hole is a notch.

8. A manufacturing method for a flexible organic electroluminescence device (OLED) display panel as claimed in claim 3, comprising steps as follows:
   providing a hard substrate;
   forming a flexible substrate on the hard substrate;
   at an upper end of the flexible substrate, cutting the flexible substrate along a direction of a thickness of the flexible substrate, and forming a through hole defined through the flexible substrate along the direction of the thickness of the flexible substrate;
   filling the through hole with a transparent layer;
   forming an organic electroluminescence device layer on the flexible substrate and the transparent layer; and
   removing the hard substrate and forming the flexible OLED display panel.

9. The manufacturing method for the flexible OLED display panel as claimed in claim 8, wherein the manufacturing method further comprises a step as follows: manufacturing a release film on the hard substrate, forming the flexible substrate on the release film.

10. The manufacturing method for the flexible OLED display panel as claimed in claim 9, wherein in the step of removing the hard substrate, the hard substrate and the release film are removed by a mechanical stripping process.

11. The manufacturing method for the flexible OLED display panel as claimed in claim 8, wherein the step of filling the through hole with the transparent layer comprises steps as follows:
 coating a photoresist layer on the flexible substrate, wherein the photoresist layer is filled into the through hole and covers the flexible substrate; and
 removing the photoresist layer on the flexible substrate while retaining the photoresist layer filled in the through hole, wherein the photoresist layer filled in the through hole serves as the transparent layer.

12. The manufacturing method for the flexible OLED display panel as claimed in claim 11, wherein in the step of removing the photoresist layer on the flexible substrate, a thickness of the photoresist layer filled in the through hole is decreased, such that a surface of the photoresist layer filled in the through hole is flush with a surface of the flexible substrate.

* * * * *